(12) United States Patent
Shin

(10) Patent No.: US 12,136,561 B2
(45) Date of Patent: Nov. 5, 2024

(54) SUBSTRATE TRANSFER DEVICE

(71) Applicant: SAMSUNG ELECTRONICS CO., LTD., Suwon-si (KR)

(72) Inventor: Sanglyong Shin, Cheonan-si (KR)

(73) Assignee: Samsung Electronics Co., Ltd. (KR)

( * ) Notice: Subject to any disclaimer, the term of this patent is extended or adjusted under 35 U.S.C. 154(b) by 392 days.

(21) Appl. No.: 17/715,782

(22) Filed: Apr. 7, 2022

(65) Prior Publication Data

US 2023/0108525 A1 Apr. 6, 2023

(30) Foreign Application Priority Data

Oct. 6, 2021 (KR) .................. 10-2021-0132410

(51) Int. Cl.
*H01L 21/677* (2006.01)

(52) U.S. Cl.
CPC .. *H01L 21/67766* (2013.01); *H01L 21/67733* (2013.01)

(58) Field of Classification Search
CPC ......... H01L 21/67778; H01L 21/67383; H01L 21/67766; H01L 21/67733; H01L 21/67379; H01L 21/67326; H01L 21/67313; H01L 21/67303; H01L 21/67309; H01L 21/67346; H01L 21/6734
See application file for complete search history.

(56) References Cited

U.S. PATENT DOCUMENTS

| 5,310,339 A | * | 5/1994 | Ushikawa | ......... H01L 21/67115 432/259 |
| 7,857,140 B2 | | 12/2010 | Shinjo et al. | |
| 2008/0273959 A1 | * | 11/2008 | Bunod | .............. H01L 21/67383 414/801 |
| 2016/0273836 A1 | | 9/2016 | Obara et al. | |
| 2021/0384055 A1 | * | 12/2021 | Kim | .................... H01L 21/6732 |

FOREIGN PATENT DOCUMENTS

| JP | 2010-182949 A | 8/2010 |
| JP | 5993592 B2 | 9/2016 |
| KR | 10-2006-0044193 A | 5/2006 |
| KR | 10-0771703 B1 | 10/2007 |
| KR | 10-1263252 B1 | 5/2013 |
| KR | 10-1386618 B1 | 4/2014 |
| KR | 10-1890187 B1 | 9/2018 |
| KR | 10-1924185 B1 | 11/2018 |
| KR | 10-2053489 B1 | 12/2019 |

* cited by examiner

*Primary Examiner* — Glenn F Myers
(74) *Attorney, Agent, or Firm* — Fish & Richardson P.C.

(57) ABSTRACT

Disclosed is a semiconductor transfer device comprising a housing having a surface that has an opening through which a substrate is introduced, and a substrate hold structure that fixes the substrate in the housing. The substrate hold structure includes a lower support that extends onto a bottom surface of the substrate from one of inner surfaces of the housing, and an upper support that extends toward a side of the substrate from one of the inner surfaces of the housing and includes a second hold member. An operation of the upper support causes the second hold member to move onto the substrate such that the second hold member contacts a top surface of the substrate and overlaps the first hold member. An extension part penetrates the housing and protrudes onto an outer surface of the housing.

20 Claims, 9 Drawing Sheets

SUBSTRATE TRANSFER DEVICE

CROSS-REFERENCE TO RELATED APPLICATION

This U.S. non-provisional application claims priority under 35 U.S.C § 119 to Korean Patent Application No. 10-2021-0132410 filed on Oct. 6, 2021, in the Korean Intellectual Property Office, the disclosure of which is hereby incorporated by reference in its entirety.

BACKGROUND

The present inventive concepts relate to a substrate transfer device, and more particularly, to a substrate transfer device for an automated delivery system.

In semiconductor or liquid-crystal fabrication facilities, a carrier on which articles are loaded (e.g., wafer or substrate) and used for processing of such articles, is transferred, based on fabrication process demands, between manufacturing and storage apparatuses. The manufacturing apparatus mainly adopts an automated material handling system (AMHS) for article transfer in the fabrication process. There is, in known technology, a vehicle transfer system including an overhead hoist transport (OHT) system and an overhead shuttle (OHS) system each of which transfers objects traveling on tracks suspended on the ceiling that also includes a transfer system which uses a transport cart automatically traveling on the floor.

A semiconductor fabrication process is typically performed, in which a wafer transfer robot is used to transfer a substrate between a front opening unified pod (FOUP) rest on a load port and a chamber in which a process is executed.

When such transfer device repetitively performs the substrate transfer, substrate abrasion or substrate warpage may occur that leads to a reduction in transfer accuracy, failure, or unexpected difficulties, and as a result, the overall semiconductor facility may decrease its output.

SUMMARY

Some exemplary embodiments of the present inventive concepts provide a substrate transfer device with improved storage stability. Some exemplary embodiments of the present inventive concepts provide a substrate transfer device with an increased amount of storage.

According to some exemplary embodiments of the present inventive concepts, a substrate transfer device may comprise: a housing having one surface that has an opening through which a substrate is introduced; a substrate hold structure that fixes the substrate in the housing. The substrate hold structure may include: a lower support that extends onto a bottom surface of the substrate from one of inner surfaces of the housing, the lower support including a first hold member beneath the substrate; and an upper support that extends toward a side of the substrate from one of the inner surfaces of the housing, the upper support including a second hold member. An operation of the upper support may cause the second hold member to move onto the substrate such that the second hold member may contact a top surface of the substrate and overlap the first hold member with the substrate between the second hold member and the first hold member. An extension part of the upper support may penetrate the housing and protrude onto an outer surface of the housing.

According to some exemplary embodiments of the present inventive concepts, a substrate transfer device may comprise: a housing having one surface that has an opening through which a substrate is introduced; a lower support fixed to a first inner surface of the housing, the lower support supporting the substrate from beneath the substrate; and an upper support connected to the first inner surface and being capable of rotational operation in a direction perpendicular to the first inner surface of the housing, the upper support extending onto the substrate. The lower support may include a first hold member beneath the substrate. The upper support may include a second hold member above the substrate. The rotational operation of the upper support may cause: a first operation in which the upper supporter does not overlap the substrate when viewed in a plan view; and a second operation in which the second hold member moves onto the substrate to push the substrate to the lower support.

According to some exemplary embodiments of the present inventive concepts, a substrate transfer device may comprise: a housing having one surface has an opening through which a substrate is introduced, the housing having a first inner surface and a second inner surface that are adjacent to each other; a lower support that extends from the first inner surface of the housing onto a bottom surface of the substrate; and an upper support that extends from the second inner surface of the housing onto a top surface of the substrate and is connected to the second inner surface and being capable of rotational operation in a direction perpendicular to the second inner surface of the housing. The lower support may include a first hold member beneath the substrate. The upper support may include a second hold member above the substrate. The rotational operation of the upper support may cause: a first operation in which the upper support moves toward a side of the substrate; and a second operation in which the upper supporter moves onto and contacts the top surface of the substrate.

DETAILED DESCRIPTION OF THE PREFFERED EMBODIMENTS

The following will now describe a substrate transfer device according to the present inventive concepts with reference to the accompanying drawings.

Figure 1:
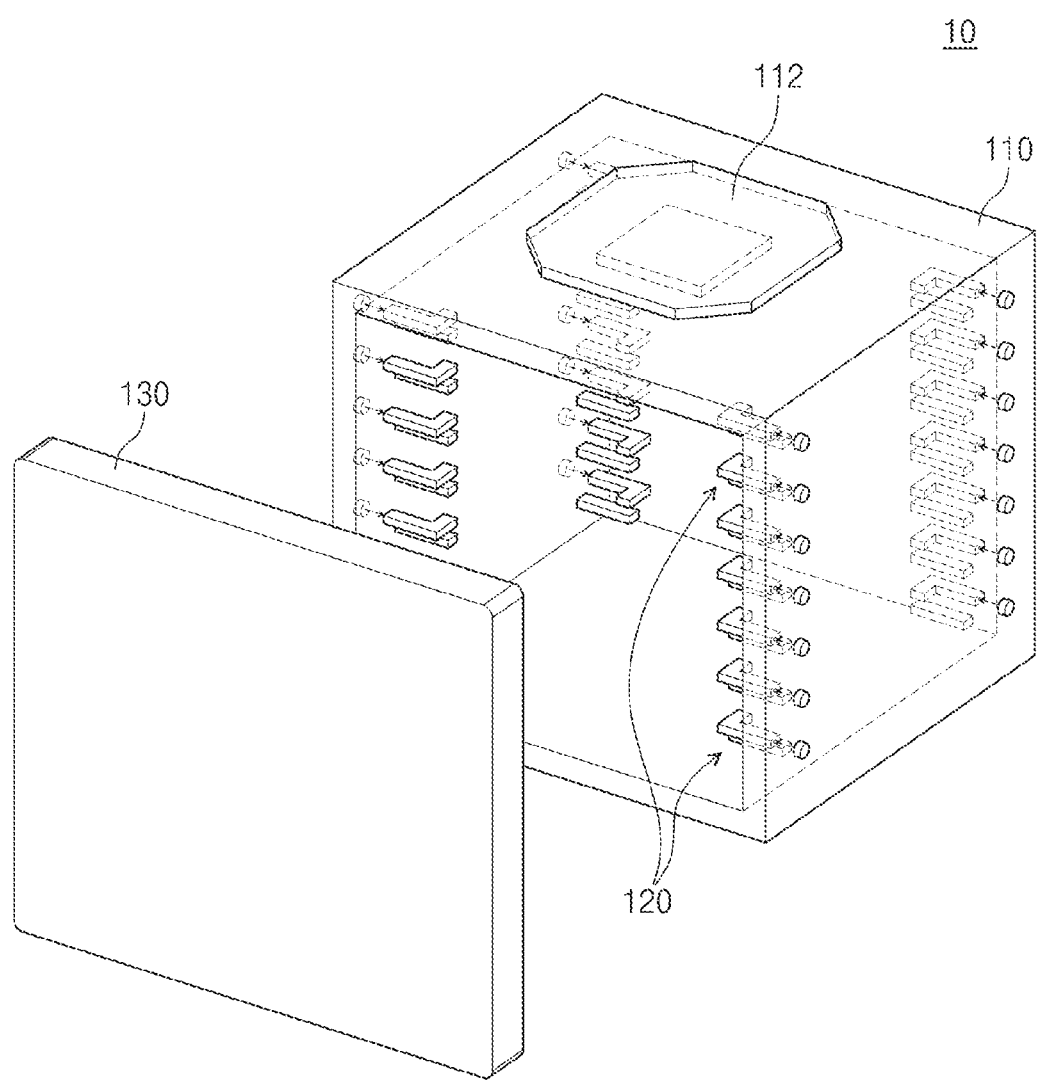
FIG. 1 illustrates a perspective view showing a substrate transfer device according to some exemplary embodiments of the present inventive concepts.
Figure 2:
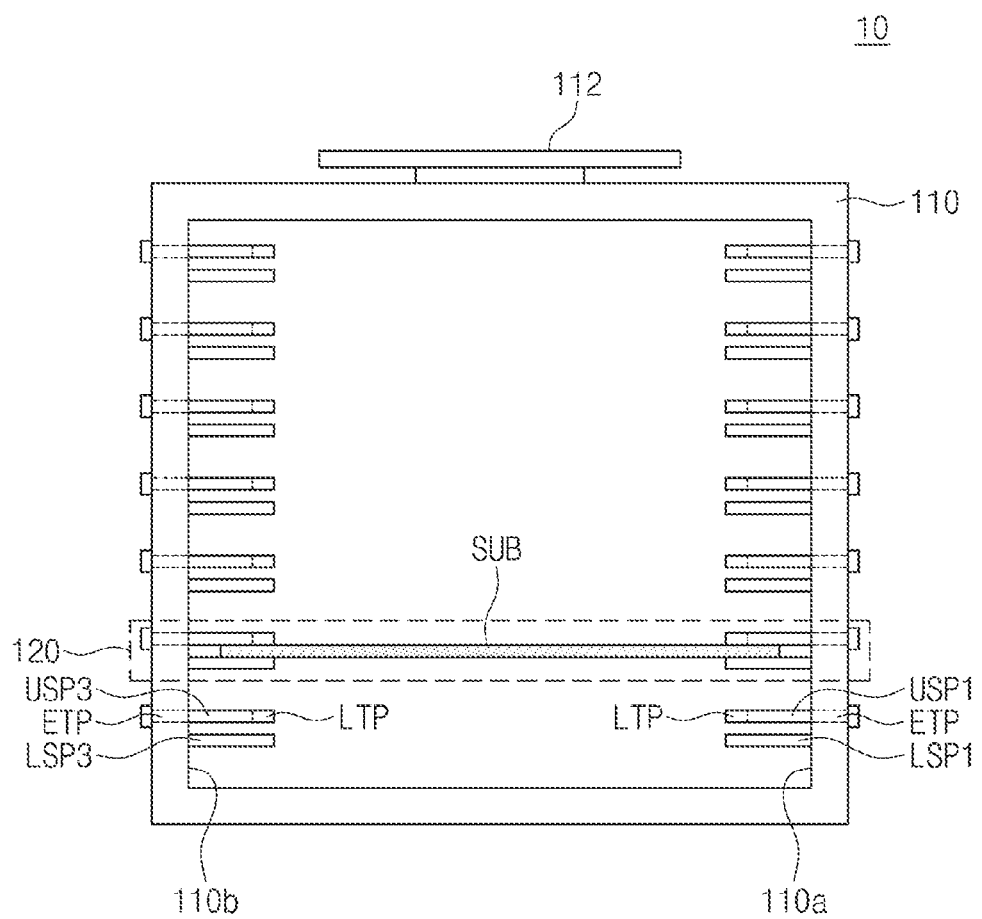
FIG. 2 illustrates a front view showing a substrate transfer device according to some exemplary embodiments of the present inventive concepts.
Figure 3:
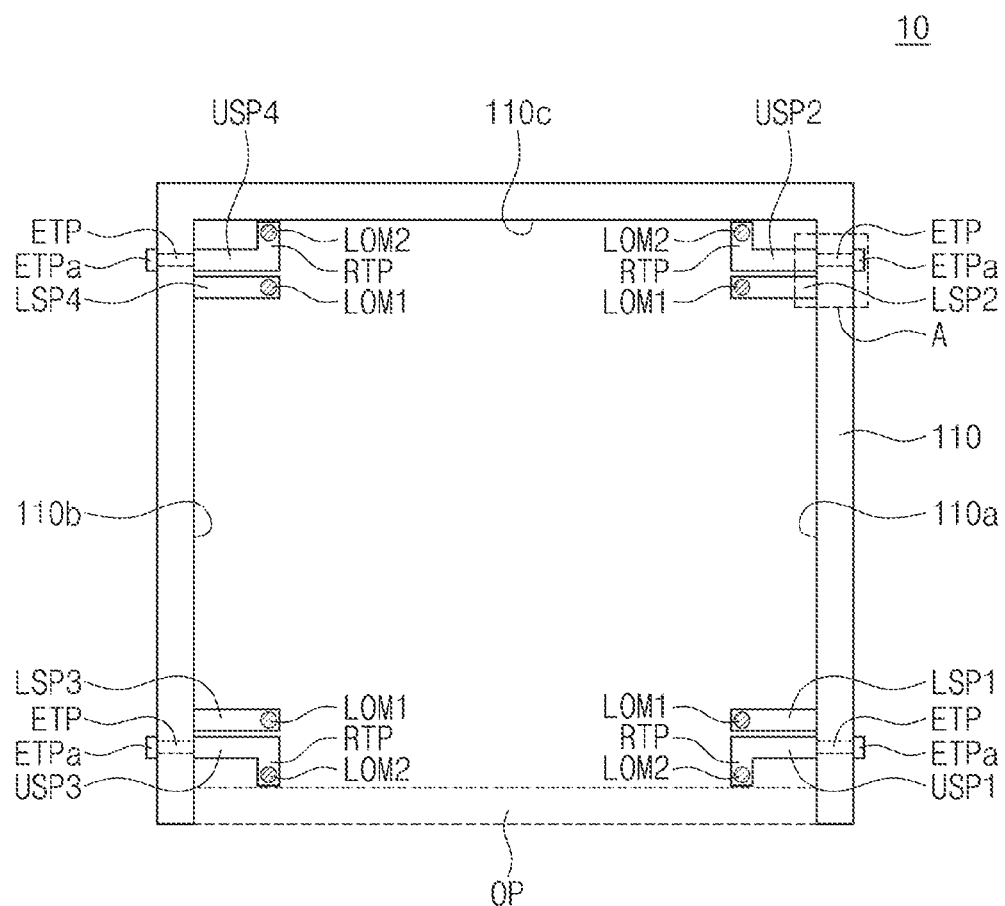
FIG. 3 illustrates a plan view showing a substrate transfer device according to some exemplary embodiments of the present inventive concepts.
Figure 4:
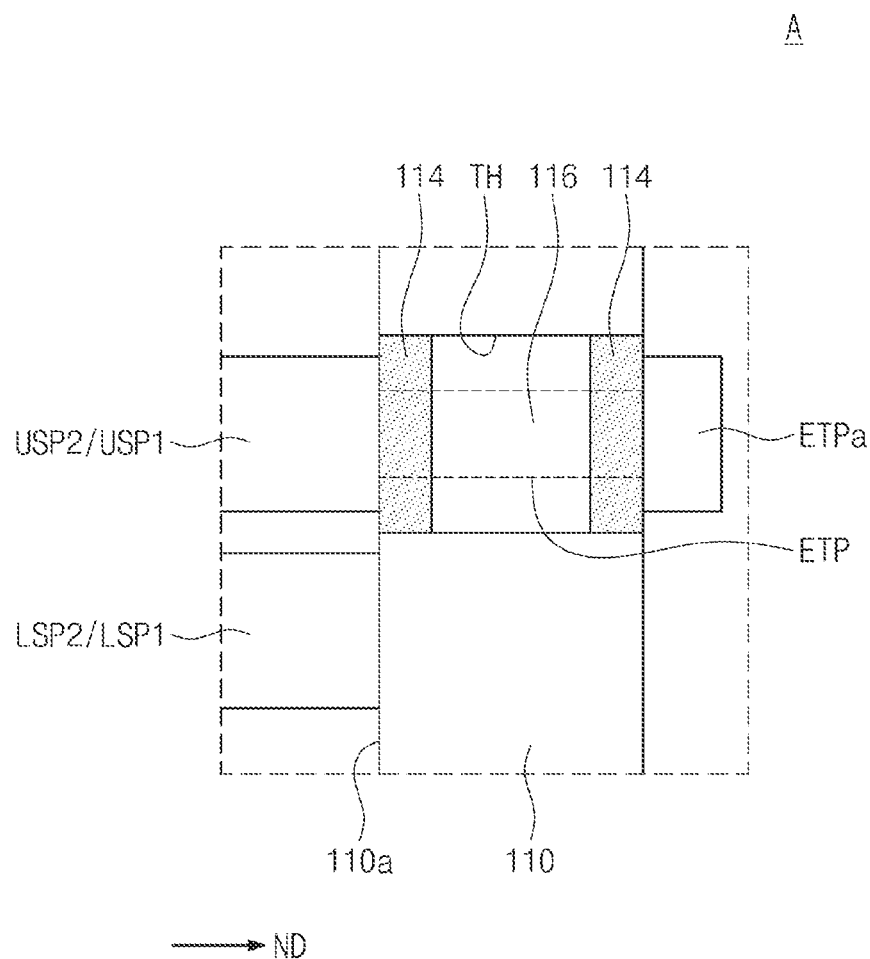
FIG. 4 illustrates an enlarged view showing section A of FIG. 3.
Figure 5:
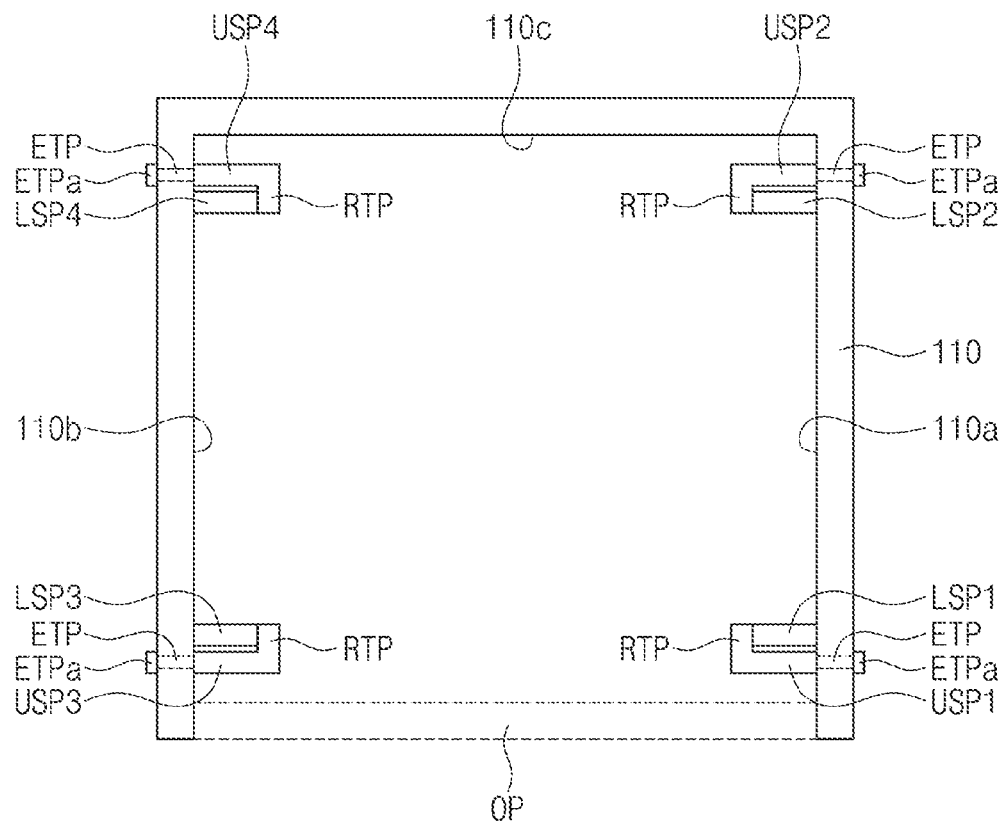
FIG. 5 illustrates a plan view showing a substrate transfer device according to some exemplary embodiments of the present inventive concepts.

FIG. 1 illustrates a perspective view showing a substrate transfer device according to some exemplary embodiments of the present inventive concepts. FIG. 2 illustrates a front view showing a substrate transfer device according to some exemplary embodiments of the present inventive concepts. FIG. 3 illustrates a plan view showing a substrate transfer device according to some exemplary embodiments of the present inventive concepts. FIG. 4 illustrates an enlarged view showing section A of FIG. 3. FIG. 5 illustrates a plan view showing a substrate transfer device according to some exemplary embodiments of the present inventive concepts.

Referring to FIGS. 1 to 5, a substrate transfer device 10 may include a housing 110, substrate hold structures 120, and a door 130.

The housing 110 may constitute a body of the substrate transfer device 10. The housing 110 may correspond to a cassette that is called a front opening unified pod (FOUP). For example, the housing 110 may have a hexahedral shape as a whole. Alternatively, different from that shown, the housing 110 may be provided in the form of a container having a hexahedral shape as a whole with circular or oval shaped rear side (opposite to a side where an opening is formed) when viewed from above. The shape of the housing 110 may be changed based on a shape of a substrate SUB that is loaded in the substrate transfer device 10. The housing 110 may have an internal space in which the substrate SUB is loaded. The housing 110 may have a first inner surface 110a and a second inner surface 110b that are opposite to each other and are adjacent to an opening OP which will be discussed below, and may also have a third inner surface 110c opposite to the opening OP.

The housing 110 may be provided thereon with a connection member 112 in which the substrate transfer device 10 is gripped by a FOUP transfer apparatus such as an overhead hoist transport (OHT).

An opening OP may be provided on a front side of the housing 110. The opening OP may have a tetragonal shape. The substrate SUB may be loaded through the opening OP into the substrate transfer device 10. For example, a transfer robot may load the substrate SUB through the opening OP into the housing 110 or may unload the substrate SUB through the opening OP from the housing 110.

The door 130 may open and close the opening OP of the housing 110. The door 130 may be detachably installed on a front surface on which is formed the opening OP of the housing 110. A door opening provided on a transfer robot or any other suitable semiconductor apparatus may detach or attach the door 130 from or to the housing 110. Therefore, the opening OP may be opened or closed.

The substrate hold structure 120 may be provided on an inner surface of the housing 110. When viewed from above, the substrate hold structure 120 may be provided on at least a portion of inner surfaces other than the front surface of the housing 110. The substrate SUB may be placed on the substrate hold structure 120.

The substrate transfer device 10 may be provided therein with a plurality of substrate hold structures 120 that are vertically spaced apart from each other to simultaneously accommodate a plurality of substrates. For example, about 25 substrate hold structures 120 may be provided in the housing 110 to receive about 25 substrates SUB. For convenience of description, FIGS. 1 and 2 depict that 7 substrate hold structures 120 are provided, but the present inventive concept is not limited thereto. The following will describe a detailed configuration of one substrate hold structures 120.

The substrate hold structure 120 may have first, second, third, and fourth lower supporters LSP1, LSP2, LSP3, and LSP4, and may also have first, second, third, and fourth upper supports USP1, USP2, USP3, and USP4 that correspond to the first, second, third, and fourth lower supports LSP1, LSP2, LSP3, and LSP4.

The first and second lower supports LSP1 and LSP2 may be provided on the first inner surface 110a of the housing 110. The first and second lower supports LSP1 and LSP2 may be connected and fixed to the first inner surface 110a. For example, the first and second lower supports LSP1 and LSP2 may each have a shape that protrudes from the first inner surface 110a toward the second inner surface 110b.

The third and fourth lower supports LSP3 and LSP4 may be provided on the second inner surface 110b of the housing 110. The third and fourth lower supports LSP3 and LSP4 may be connected and fixed to the second inner surface 110b. For example, the third and fourth lower supports LSP3 and LSP4 may each have a shape that protrudes from the second inner surface 110b toward the first inner surface 110a. The first and third lower supports LSP1 and LSP3 may be disposed adjacent to the opening OP, and the second and fourth lower supports LSP2 and LSP4 may be disposed adjacent to the third inner surface 110c of the housing 110. For example, when viewed in a plan view, the first, second, third, and fourth lower supports LSP1, LSP2, LSP3, and LSP4 may be disposed correspondingly adjacent to the four corners of an internal space in the housing 110.

The first, second, third, and fourth lower supports LSP1, LSP2, LSP3, and LSP4 may be located at the same level. For example, the first, second, third, and fourth lower supports LSP1, LSP2, LSP3, and LSP4 may be positioned on one plane parallel to a bottom surface of the housing 110. Each of the first, second, third, and fourth lower supports LSP1, LSP2, LSP3, and LSP4 may have a linear or rectangular shape when viewed in a plan view. The present inventive concepts, however, are not limited thereto, and the first, second, third, and fourth lower supports LSP1, LSP2, LSP3, and LSP4 may have various shapes that are sufficiently rigid to support the substrate SUB.

Each of the first, second, third, and fourth lower supports LSP1, LSP2, LSP3, and LSP4 may have a first hold member LOM1. The first hold members LOM1 may be correspondingly provided at distal ends of the first, second, third, and fourth lower supports LSP1, LSP2, LSP3, and LSP4. For example, the first and second lower supports LSP1 and LSP2 may have their first hold members LOM1 at their distal ends far from the first inner surface 110a of the housing 110. For example, the third and fourth lower supports LSP3 and LSP4 may have their first hold members LOM1 at their distal ends far from the second inner surface 110b of the housing 110. The first hold members LOM1 may be exposed on top surfaces of the first, second, third, and fourth lower supports LSP1, LSP2, LSP3, and LSP4. For example, the top surface of each of the first, second, third, and fourth lower supports LSP1, LSP2, LSP3, and LSP4 may be coplanar with that of the first hold member LOM1 of the each of the first, second, third, and fourth lower supports LSP1, LSP2, LSP3, and LSP4. The present inventive concepts, however, are not limited thereto, and the first hold member LOM1 may have a shape that protrudes from the top surface of a corresponding one of the first, second, third, and fourth lower supports LSP1, LSP2, LSP3, and LSP4. Alternatively, the first hold members LOM1 may be correspondingly provided buried in the first, second, third, and fourth lower supports LSP1, LSP2, LSP3, and LSP4, or may be exposed on a bottom surface of a corresponding one of the first, second, third, and fourth lower supports LSP1, LSP2, LSP3, and LSP4. The first hold members LOM1 may include a magnetic material with first magnetism. For example, the first hold members LOM1 may each be a magnet. The first magnetism may be one of N and S magnetic poles. According to some exemplary embodiments, the magnetism of the first hold members LOM1 may not be the same as each other.

The first, second, third, and fourth upper supports USP1, USP2, USP3, and USP4 may correspond to the first, second, third, and fourth lower supports LSP1, LSP2, LSP3, and LSP4.

The first and second upper supports USP1 and USP2 may be provided on the first inner surface 110a of the housing 110. The first and second upper supports USP1 and USP2 may be connected to the first inner surface 110a of the housing 110. For example, the first and second upper supports USP1 and USP2 may each have a shape that protrudes from the first inner surface 110a toward the second inner surface 110b. The third and fourth upper supports USP3 and USP4 may be provided on the second inner surface 110b of the housing 110. The third and fourth upper supports USP3 and USP4 may be connected to the second inner surface 110b of the housing 110. For example, the third and fourth upper supports USP3 and USP4 may each have a shape that protrudes from the second inner surface 110b toward the first inner surface 110a. The first and third upper supports USP1 and USP3 may be disposed adjacent to the opening OP, and the second and fourth upper supports USP2 and USP4 may be disposed adjacent to the third inner surface 110c of the housing 110. For example, when viewed in a plan view, the first, second, third, and fourth upper supports USP1, USP2, USP3, and USP4 may be disposed correspondingly adjacent to the four corners of an internal space in the housing 110.

The first, second, third, and fourth upper supports USP1, USP2, USP3, and USP4 may be located at the same level. For example, the first, second, third, and fourth upper supports USP1, USP2, USP3, and USP4 may be positioned on one plane parallel to the bottom surface of the housing 110. The first, second, third, and fourth upper supports USP1, USP2, USP3, and USP4 may be located at a higher level than that of the first, second, third, and fourth lower supports LSP1, LSP2, LSP3, and LSP4. When viewed in a plan view, the first and third upper supports USP1 and USP3 may be disposed closer to the opening OP than the first and third lower supports LSP1 and LSP3. When viewed in a plan view, the second and fourth upper supports USP2 and USP4 may be disposed closer to the third inner surface 110c than the second and fourth lower supports LSP2 and LSP4. For example, the first, second, third, and fourth lower supports LSP1, LSP2, LSP3, and LSP4 may be positioned inside the first, second, third, and fourth upper supports USP1, USP2, USP3, and USP4. The substrate SUB may be placed on the first hold members LOM1, and thus the first and third upper supports USP1 and USP3 may extend to run across between the substrate SUB and the opening OP, and the second and fourth upper supports USP2 and USP4 may extend to run across between the substrate SUB and the third inner surface 110c.

Each of the first, second, third, and fourth upper supports USP1, USP2, USP3, and USP4 may be rotatably connected to the housing 110. For example, each of the first, second, third, and fourth upper supports USP1, USP2, USP3, and USP4 may have an extension part ETP. The extension part ETP may extend from a distal end of a corresponding one of the first, second, third, and fourth upper supports USP1, USP2, USP3, and USP4. The extension parts ETP of the first and second upper supports USP1 and USP2 may penetrate the first inner surface 110a of the housing 110. The extension parts ETP of the third and fourth upper supports USP3 and USP4 may penetrate the second inner surface 110b of the housing 110. The extension parts ETP of the first and third upper supports USP1 and USP3 may be disposed adjacent to the opening OP, and the extension parts ETP of the second and fourth upper supports USP2 and USP4 may be disposed adjacent to the third inner surface 110c of the housing 110.

With reference to FIG. 4, the following will describe in detail that the first, second, third, and fourth upper supports USP1, USP2, USP3, and USP4 are connected to the housing 110.

Referring to FIGS. 3 and 4, through holes TH may be provided in the first inner surface 110a and the second inner surface 110b of the housing 110. The through holes TH may be disposed to correspond to the first, second, third, and fourth upper supports USP1, USP2, USP3, and USP4. The through holes TH may completely penetrate the first inner surface 110a or the second inner surface 110b of the housing 110 to connect an inside of the housing 110 to an exterior of the housing 110.

The extension parts ETP may penetrate the through holes TH formed on the housing 110. Each of the extension parts ETP may have a cylindrical shape that extends in a direction (or a vertical direction ND of FIG. 4) perpendicular to the first inner surface 110a or the second inner surface 110b. The extension part ETP may have various shapes to allow the extension part ETP to easily rotate about an axis that extends along the vertical direction ND.

The through hole TH may be provided therein with rotation structures 114 and 116 that allow the extension part ETP to easily rotate in the through hole TH. The rotation structures 114 and 116 may include a pair of retainer rings 114 and a bearing 116 between the pair of retainer rings 114. In one through hole TH, the retainer rings 114 and the bearing 116 may surround the extension part ETP that penetrates the through hole TH. For example, the retainer rings 114 and the bearing 116 may reduce friction between the extension part ETP and the through hole TH. However, no limitation is imposed on configurations of the rotation structures 114 and 116. For example, various components may be provided to assist rotation of the first, second, third, and fourth upper supports USP1, USP2, USP3, and USP4, or none of the rotation structures 114 and 116 may be provided.

Figure 6:
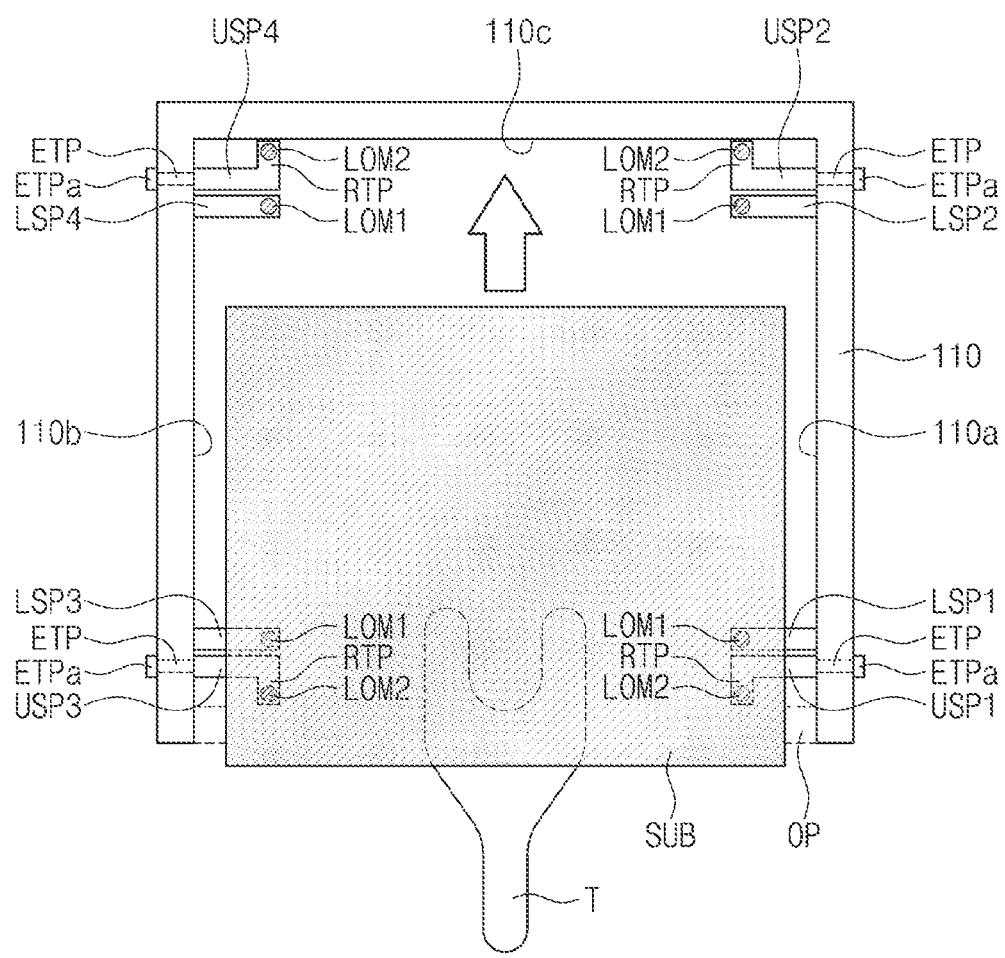
FIGS. 6 and 7 illustrate plan views showing operations of a substrate transfer device according to some exemplary embodiments of the present inventive concepts.
Figure 7:
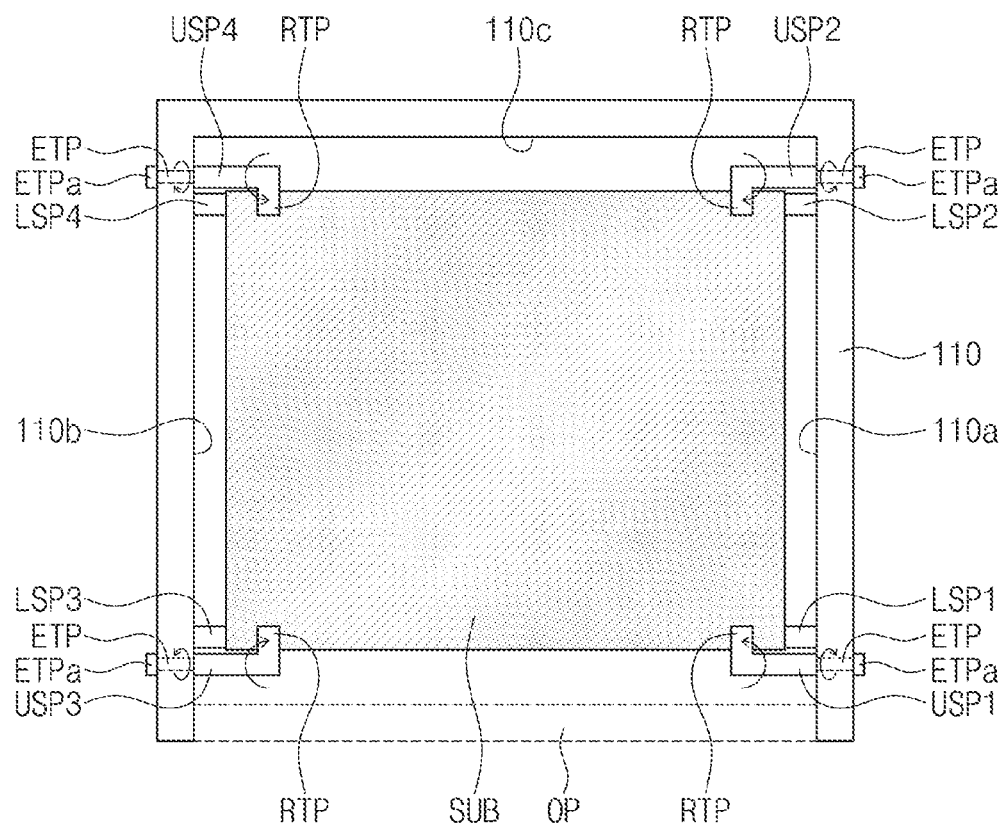

The extension part ETP may have a portion ETPa that protrudes onto an outer surface of the housing 110. The portions ETPa of the extension parts ETP may be components through which rotational operations of the first, second, third, and fourth upper supporters USP1, USP2, USP3, and USP4 are controlled at outside the substrate transfer device 10. With reference to FIGS. 6 and 7, the following will describe detailed rotational operations of the first, second, third, and fourth upper supports USP1, USP2, USP3, and USP4.

Referring back to FIGS. 1 to 5, each of the first, second, third, and fourth upper supports USP1, USP2, USP3, and USP4 may have a rotation part RTP. The rotation parts RTP may be correspondingly adjacent to opposing ends of the first, second, third, and fourth upper supports USP1, USP2, USP3, and USP4. The opposing ends of the first, second, third, and fourth upper supports USP1, USP2, USP3, and USP4 may stand opposite to the distal ends, to which the extension parts ETP are connected, of the first, second, third, and fourth upper supports USP1, USP2, USP3, and USP4. The rotation parts RTP may correspondingly protrude from the first, second, third, and fourth upper supports USP1, USP2, USP3, and USP4. The rotation parts RTP may have their protruding directions that are correspondingly orthogonal to extending directions of the first, second, third, and fourth upper supports USP1, USP2, USP3, and USP4. For example, each of the first, second, third, and fourth upper supports USP1, USP2, USP3, and USP4 may have an L shape when viewed in a plan view.

As shown in FIG. 3, the rotation parts RTP may protrude from the first, second, third, and fourth upper supports USP1, USP2, USP3, and USP4 in directions away from the first, second, third, and fourth lower supports LSP1, LSP2, LSP3, and LSP4. For example, the rotation parts RTP of the first and third upper supports USP1 and USP3 may extend toward the opening OP, and the rotation parts RTP of the second and fourth upper supports USP2 and USP4 may protrude toward the third inner surface 110c of the housing 110. Therefore, the first, second, third, and fourth upper supports USP1, USP2, USP3, and USP4 may not vertically overlap the first, second, third, and fourth lower supports LSP1, LSP2, LSP3, and LSP4. Alternatively, as shown in FIG. 5, the rotation parts RTP may protrude from the first, second, third, and fourth upper supports USP1, USP2, USP3, and USP4 in directions toward and above the first, second, third, and fourth lower supports LSP1, LSP2, LSP3, and LSP4. The rotation parts RTP may be positioned on the first, second, third, and fourth lower supports LSP1, LSP2, LSP3, and LSP4. For example, the rotation parts RTP may be correspondingly positioned on the first hold members LOM1 of the first, second, third, and fourth lower supports LSP1, LSP2, LSP3, and LSP4. However, as the rotation parts RTP are rotatably connected to the housing 110, the rotation parts RTP may have their positions modified based on operations of the first, second, third, and fourth upper supports USP1, USP2, USP3, and USP4, and no limitation is imposed on the positions of the rotation parts RTP.

The rotation parts RTP of the first, second, third, and fourth upper supports USP1, USP2, USP3, and USP4 may be vertically spaced apart from the first, second, third, and fourth lower supports LSP1, LSP2, LSP3, and LSP4. For example, as shown in FIG. 2, the first, second, third, and fourth upper supports USP1, USP2, USP3, and USP4 may be located at a higher level than that of the first, second, third, and fourth lower supports LSP1, LSP2, LSP3, and LSP4. When viewed in a cross section of the substrate transfer device 10, the first to fourth upper supports USP1 to USP4 and the first to fourth lower supports LSP1 to LSP4 may have between them a vertical interval (or a vertical interval between the rotation parts RTP and the first to fourth lower supports LSP1 to LSP4) that corresponds to a thickness of the substrate SUB. For example, the first to fourth upper supports USP1 to USP4 and the first to fourth lower supports LSP1 to LSP4 may be structures that are spaced apart from each other across the substrate SUB and are provided to hold the substrate SUB.

Each of the first, second, third, and fourth upper supports USP1, USP2, USP3, and USP4 may have a second hold member LOM2. The second hold members LOM2 may be correspondingly provided on the rotation parts RTP of the first, second, third, and fourth upper supports USP1, USP2, USP3, and USP4. The second hold members LOM2 may be positioned on the first hold members LOM1, and each of the second hold members LOM2 may vertically overlap a corresponding one of the first hold members LOM1. The second hold members LOM2 may be exposed on bottom surfaces of the first, second, third, and fourth upper supports USP1, USP2, USP3, and USP4. In this description, the bottom surfaces of the first, second, third, and fourth upper supports USP1, USP2, USP3, and USP4 may be defined as described in connection with FIG. 3, and may correspond to certain surfaces of the rotation parts RTP of the first, second, third, and fourth upper supports USP1, USP2, USP3, and USP4, in which certain surfaces of the rotation parts RTP face the first, second, third, and fourth lower supports LSP1, LSP2, LSP3, and LSP4. For example, the certain surfaces of the rotation parts RTP of the first, second, third, and fourth upper supports USP1, USP2, USP3, and USP4 may be correspondingly coplanar with top surfaces of the second hold members LOM2 of the first, second, third, and fourth upper supports USP1, USP2, USP3, and USP4. The present inventive concepts, however, are not limited thereto, and the second hold members LOM2 may have shapes that protrude from the certain surfaces of the rotation parts RTP of the first, second, third, and fourth upper supports USP1, USP2, USP3, and USP4. Alternatively, the second hold members LOM2 may be provided as to be buried in corresponding rotation parts RTP of the first, second, third, and fourth upper supports USP1, USP2, USP3, and USP4, or may be exposed on top surfaces of the rotation parts RTP of the first, second, third, and fourth upper supports USP1, USP2, USP3, and USP4.

The second hold members LOM2 may include a magnetic material with second magnetism. For example, the second hold members LOM2 may each be a magnet. The second magnetism may be opposite to the first magnetism of the first hold members LOM1. The second magnetism may be one of N and S magnetic poles. According to some exemplary embodiments, the magnetism of the second hold members LOM2 may not be the same as each other. In this case, it may be enough that magnetism of the first hold member LOM1 is different from magnetism of the second hold member LOM2 opposite to the first hold member LOM1, and magnetism between the first hold members LOM1 or between the second hold members LOM2 may be the same as, or different from each other.

The rotation parts RTP may be portions whose positions are substantially changed due to rotational operations of the first, second, third, and fourth upper supports USP1, USP2, USP3, and USP4. For example, as shown in FIG. 3, the rotation parts RTP may be positioned in directions away from the first, second, third, and fourth lower supports LSP1, LSP2, LSP3, and LSP4. In this case, the first, second, third, and fourth lower supports LSP1, LSP2, LSP3, and LSP4 may not overlap the first, second, third, and fourth upper supports USP1, USP2, USP3, and USP4, and in particular the first hold members LOM1 of the first, second, third, and fourth lower supports LSP1, LSP2, LSP3, and LSP4 may not overlap the second hold members LOM2 of the first, second, third, and fourth upper supports USP1, USP2, USP3, and USP4.

When the first, second, third, and fourth upper supports USP1, USP2, USP3, and USP4 rotate about their extension parts ETP, as shown in FIG. 5, the rotation parts RTP may be correspondingly positioned above the first, second, third, and fourth lower supports LSP1, LSP2, LSP3, and LSP4. In this case, the first, second, third, and fourth lower supports LSP1, LSP2, LSP3, and LSP4 may overlap the rotation parts RTP of the first, second, third, and fourth upper supporters USP1, USP2, USP3, and USP4, and in particular the first hold members LOM1 of the first, second, third, and fourth lower supports LSP1, LSP2, LSP3, and LSP4 may vertically overlap the second hold members LOM2 of the first, second, third, and fourth upper supports USP1, USP2, USP3, and USP4.

FIGS. 6 and 7 illustrate plan views showing operations of a substrate transfer device according to some exemplary embodiments of the present inventive concepts.

Referring to FIGS. 1 and 6, a worker or a transfer apparatus such as an overhead hoist transfer may place the substrate transfer device 10 on a load port. When the substrate transfer device 10 is placed on the load port, a door opener or the like may detach the door 130 from the housing 110. Therefore, the opening OP at the front side of the housing 110 may be opened.

In this case, the first, second, third, and fourth upper supports USP1, USP2, USP3, and USP4 may perform a first operation. For example, the first, second, third, and fourth upper supports USP1, USP2, USP3, and USP4 may rotate by manipulating the portions ETPa of the extension parts ETP, which portions ETPa extend outwardly from the housing 110. In the first operation, the rotation parts RTP may move so as not to overlap the first, second, third, and fourth lower supports LSP1, LSP2, LSP3, and LSP4. For example, the rotation parts RTP of the first and third upper supporters USP1 and USP3 may move adjacent to the opening OP, and the rotation parts RTP of the second and fourth upper supports USP2 and USP4 may move adjacent to the third inner surface 110c. Therefore, when viewed in a plan view, the first, second, third, and fourth upper supports USP1, USP2, USP3, and USP4 may not be positioned on the first, second, third, and fourth lower supports LSP1, LSP2, LSP3, and LSP4, and may not be disposed in a space inside the first, second, third, and fourth lower supports LSP1, LSP2, LSP3, and LSP4. For example, a space above the first to fourth lower supports LSP1 to LSP4 may open.

When the housing 110 is opened, the substrate SUB may be introduced into the housing 110. The substrate SUB may be a panel with a tetragonal shape when viewed in a plan view. However, no limitation is imposed on the planar shape of the substrate SUB. A transfer robot T may introduce the substrate SUB into the housing 110. The transfer robot T may allow the substrate SUB to inwardly move through the opening OP to a load endpoint.

Referring to FIGS. 1 and 7, when the loading of the substrate SUB is completed, the transfer robot T may stop and terminate the movement of the substrate SUB. Afterwards, the transfer robot T may move downwardly to place the substrate SUB on the first, second, third, and fourth lower supports LSP1, LSP2, LSP3, and LSP4. The first, second, third, and fourth lower supports LSP1, LSP2, LSP3, and LSP4 may support four corners of the substrate SUB. For example, the first, second, third, and fourth lower supports LSP1, LSP2, LSP3, and LSP4 may have a shape that extends from the first and second inner surfaces 110a and 110b onto a bottom surface of the substrate SUB, and may be in contact with the bottom surface of the substrate SUB. As the first, second, third, and fourth upper supports USP1, USP2, USP3, and USP4 are disposed closer to an exterior of the housing 110 than the first, second, third, and fourth lower supports LSP1, LSP2, LSP3, and LSP4, when the transfer robot T moves the substrate SUB downwards, none of the first, second, third, and fourth upper supports USP1, USP2, USP3, and USP4 may impede the downward movement of the substrate SUB. For example, while the substrate SUB moves downwards, and while the substrate SUB is supported by the first, second, third, and fourth lower supports LSP1, LSP2, LSP3, and LSP4, when viewed in a plan view, none of the first, second, third, and fourth upper supports USP1, USP2, USP3, and USP4 may overlap the substrate W.

Referring to FIGS. 1, 2, and 7, after the substrate SUB is placed on the first, second, third, and fourth lower supports LSP1, LSP2, LSP3, and LSP4, a second operation may be performed by the first, second, third, and fourth upper supports USP1, USP2, USP3, and USP4. For example, as indicated by arrows shown in FIG. 7, the first, second, third, and fourth upper supports USP1, USP2, USP3, and USP4 may rotate by manipulating the portions ETPa of the extension parts ETP, which portions ETPa extend outwardly from the housing 110. In the second operation, the rotation parts RTP may move to positions on the first, second, third, and fourth lower supports LSP1, LSP2, LSP3, and LSP4. For example, the rotation parts RTP of the first and third upper supports USP1 and USP3 may move away from the opening OP, and the rotation parts RTP of the second and fourth upper supports USP2 and USP4 may move away from the third inner surface 110c. Therefore, when viewed in a plan view, the rotation parts RTP of the first, second, third, and fourth upper supports USP1, USP2, USP3, and USP4 may be positioned on the first, second, third, and fourth lower supports LSP1, LSP2, LSP3, and LSP4. The rotation parts RTP of the first, second, third, and fourth upper supports USP1, USP2, USP3, and USP4 may be in contact with a top surface of the substrate SUB.

The second operation of the first, second, third, and fourth upper supports USP1, USP2, USP3, and USP4 may place the second hold members LOM2 of the rotation parts RTP on corresponding first hold members LOM1. As magnetism of the first hold members LOM1 is different from that of the second hold members LOM2, the first, second, third, and fourth lower supports LSP1, LSP2, LSP3, and LSP4 may attract the rotation parts RTP of the first, second, third, and fourth upper supports USP1, USP2, USP3, and USP4. For example, the first, second, third, and fourth lower supports LSP1, LSP2, LSP3, and LSP4 may push the substrate SUB to the first, second, third, and fourth lower supports LSP1, LSP2, LSP3, and LSP4, and the substrate SUB may be fixed by the first, second, third, and fourth lower supports LSP1, LSP2, LSP3, and LSP4 and by the first, second, third, and fourth upper supports USP1, USP2, USP3, and USP4.

According to some exemplary embodiments of the present inventive concepts, the substrate SUB may be fixed by the first, second, third, and fourth lower supports LSP1, LSP2, LSP3, and LSP4 having the first hold members LOM1 and by the first, second, third, and fourth upper supports USP1, USP2, USP3, and USP4 having the second hold members LOM2. Therefore, the substrate SUB may be rigidly fixed and prevented from detachment during substrate transfer or storage. In addition, as the substrate SUB is pushed and fixed in up-and-down directions, the substrate SUB may be prevented from deformation such as warpage. Accordingly, the substrate transfer device 10 may have improved storage stability.

Moreover, because only the bottom surface of the substrate SUB is not supported, and because only corners of the substrate SUB are provided thereon with the first, second, third, and fourth lower supports LSP1, LSP2, LSP3, and LSP4 and with the first, second, third, and fourth upper supports USP1, USP2, USP3, and USP4, the substrate hold structure 120 may have a simplified structure and a smaller size. Furthermore, because the substrate SUB is prevented from warpage, there may be no requirement for superfluous space in consideration of warpage of the substrate SUB, and substrate hold structures 120 may be placed that are spaced apart from each other to reduce vertical intervals between the substrates SUB. Therefore, there may be an increase in storage amount of the substrates SUB in the substrate transfer device 10.

Referring still to FIGS. 1 and 7, the substrate SUB may be loaded and fixed in the substrate hold structure 120, and then the transfer robot T may move outwardly from the housing 110. Thereafter, the door 130 may close the housing 110.

Although not shown, the unloading of the substrate SUB from the substrate transfer device 10 may correspond to a reverse order of the loading of the substrate SUB into the substrate transfer device 10. The following will roughly describe a process where the substrate SUB is unloaded from the substrate transfer device 10.

When the substrate transfer device 10 is placed on the load port, a door opener or the like may detach the door 130 from the housing 110 to open the opening OP of the housing 110.

The transfer robot T may move into the housing 110 to a position beneath the substrate SUB. In this case, the first, second, third, and fourth upper supports USP1, USP2, USP3, and USP4 may perform the first operation. For example, the first, second, third, and fourth upper supports USP1, USP2, USP3, and USP4 may rotate by manipulating the portions ETPa of the extension parts ETP, which portions ETPa extend outwardly from the housing 110. In the first operation, the rotation parts RTP may move so as to not overlap the first, second, third, and fourth lower supports LSP1, LSP2, LSP3, and LSP4. A space above the first to fourth lower supports LSP1 to LSP4 may be opened.

The transfer robot T may move upwardly to ascend the substrate SUB. The substrate SUB may be separated from the first, second, third, and fourth lower supports LSP1, LSP2, LSP3, and LSP4. The substrate SUB may be supported by the transfer robot T.

The transfer robot T may carry the substrate SUB out of the housing 110. The transfer robot T may allow the substrate SUB to outwardly move through the opening OP to an unload endpoint.

After the unloading of the substrate SUB, the first, second, third, and fourth upper supports USP1, USP2, USP3, and USP4 may perform the second operation. For example, the first, second, third, and fourth upper supports USP1, USP2, USP3, and USP4 may rotate by manipulating the portions ETPa of the extension parts ETP, which portions ETPa extend outwardly from the housing 110. In the second operation, the rotation parts RTP may move to positions on the first, second, third, and fourth lower supports LSP1, LSP2, LSP3, and LSP4. The second operation may not be performed if unnecessary.

After the substrate SUB is unloaded from the substrate hold structure 120, the door 130 may close the housing 110.

Figure 8:
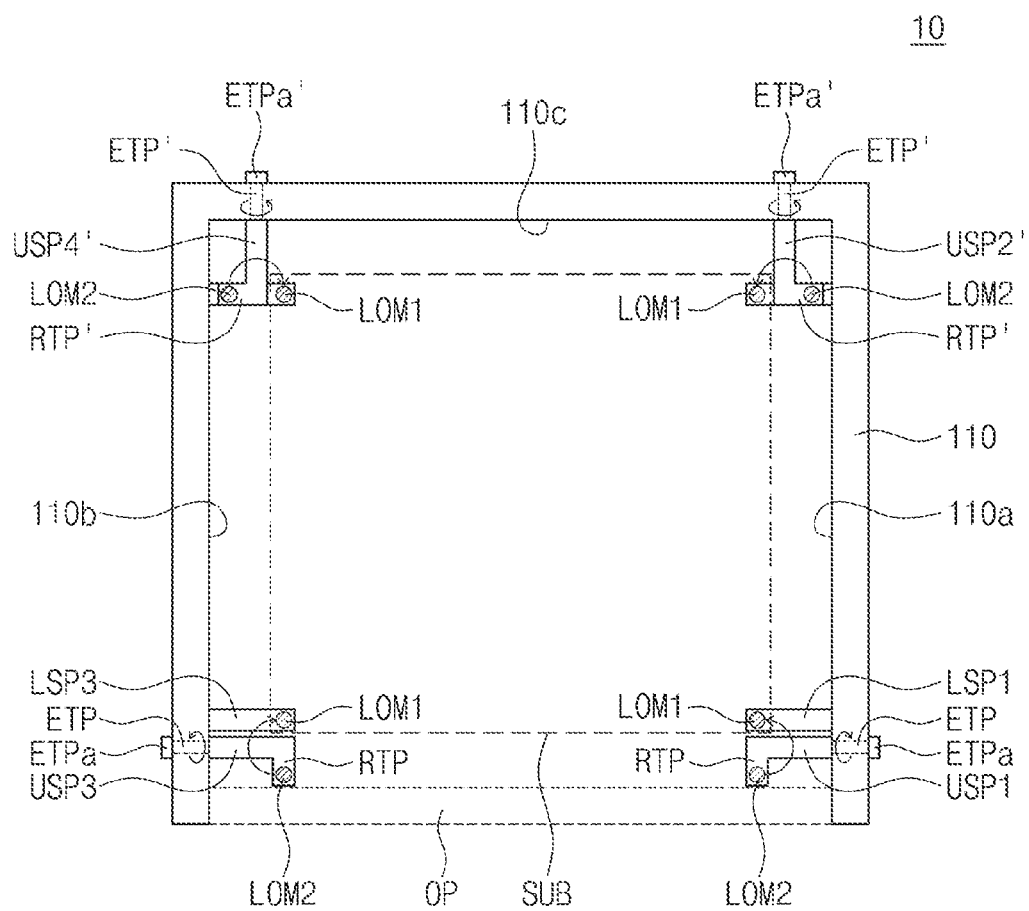
FIGS. 8 and 9 illustrate plan views showing a substrate transfer device according to some exemplary embodiments of the present inventive concepts.

FIG. 8 illustrates a plan view showing a substrate transfer device according to some exemplary embodiments of the present inventive concepts. In the embodiments that follow, components that are the same as those discussed with reference to FIGS. 1 and 7 are allocated the same reference numerals thereto, and a repetitive explanation thereof will be omitted or abridged as redundant for convenience of description. The following description will focus on differences between the exemplary embodiments of FIGS. 1 to 7 and other exemplary embodiments described below.

Referring to FIG. 8, the substrate hold structure 120 may have first, second, third, and fourth lower supports LSP1, LSP2, LSP3, and LSP4, and may also have first, second, third, and fourth upper supports USP1, USP2', USP3, and USP4'.

The first and second lower supports LSP1 and LSP2 may be provided on the first inner surface 110*a* of the housing 110. The first and second lower supports LSP1 and LSP2 may be connected and fixed to the first inner surface 110*a*. The third and fourth lower supports LSP3 and LSP4 may be provided on the second inner surface 110*b* of the housing 110. The third and fourth lower supports LSP3 and LSP4 may be connected and fixed to the second inner surface 110*b*. The first and third lower supports LSP1 and LSP3 may be disposed adjacent to the opening OP, and the second and fourth lower supports LSP2 and LSP4 may be disposed adjacent to the third inner surface 110*c* of the housing 110.

Each of the first, second, third, and fourth lower supports LSP1, LSP2, LSP3, and LSP4 may have a first hold member LOM1. The first hold members LOM1 may be correspondingly provided at distal ends of the first, second, third, and fourth lower supports LSP1, LSP2, LSP3, and LSP4. For example, the first and second lower supports LSP1 and LSP2 may have their first hold members LOM1 at their distal ends far from the first inner surface 110*a* of the housing 110. For example, the third and fourth lower supports LSP3 and LSP4 may have their first hold members LOM1 at their distal ends far from the second inner surface 110*b* of the housing 110.

The substrate SUB loaded into the housing 110 may be supported by the first, second, third, and fourth lower supports LSP1, LSP2, LSP3, and LSP4. For example, the substrate SUB may be positioned on the first hold members LOM1 of the first, second, third, and fourth lower supports LSP1, LSP2, LSP3, and LSP4.

The first upper support USP1 may be provided on the first inner surface 110*a* of the housing 110. The first upper support USP1 may be connected to the first inner surface 110*a*. For example, the first upper support USP1 may have a shape that protrudes from the first inner surface 110*a* toward the second inner surface 110*b*. The third upper support USP3 may be provided on the second inner surface 110*b* of the housing 110. The third upper support USP3 may be connected to the second inner surface 110*b*. For example, the third upper support USP3 may have a shape that protrudes from the second inner surface 110*b* toward the first inner surface 110*a*. The second and fourth upper supports USP2' and USP4' may be provided on the third inner surface 110*c* of the housing 110. The second and fourth upper supports USP2' and USP4' may be connected to the third inner surface 110*c*. For example, the second and fourth upper supports USP2' and USP4' may each have a shape that protrudes from the third inner surface 110*c* toward the opening OP. The first and third upper supports USP1 and USP3 may be disposed adjacent to the opening OP, the second upper support USP2' may be disposed adjacent to the first inner surface 110*a* of the housing 110, and the fourth upper support USP4' may be disposed adjacent to the second inner surface 110*b* of the housing 110. For example, when viewed in a plan view, the first, second, third, and fourth upper supports USP1, USP2', USP3, and USP4' may be disposed correspondingly adjacent to four corners of an internal space in the housing 110.

When viewed in a plan view, the first and third upper supports USP1 and USP3 may be disposed closer to the opening OP than the first and third lower supports LSP1 and LSP3. In addition, when viewed in a plan view, the second upper support USP2' may be disposed closer to the first inner surface 110*a* than the first hold member LOM1 of the second lower support LSP2, and the fourth upper support USP4' may be disposed closer to the second inner surface 110*b* than the first hold member LOM1 of the fourth lower support LSP4. For example, the first hold members LOM1 of the first, second, third, and fourth lower supports LSP1, LSP2, LSP3, and LSP4 may be positioned inside the first, second, third, and fourth upper supports USP1, USP2', USP3, and USP4'. The substrate SUB may be placed on the first hold members LOM1, and thus the first and third upper supports USP1 and USP3 may extend to run across between the substrate SUB and the opening OP, the second upper support USP2' may extend to run across between the substrate SUB and the first inner surface 110*a*, and the fourth upper support USP4' may extend to run across between the substrate SUB and the second inner surface 110b.

Each of the first, second, third, and fourth upper supports USP1, USP2', USP3, and USP4' may be rotatably connected to the housing 110. For example, the first, second, third, and fourth upper supports USP1, USP2', USP3, and USP4' may have their extension parts ETP and ETP'. The extension parts ETP and ETP' may extend from the distal ends of the first, second, third, and fourth upper supports USP1, USP2', USP3, and USP4'. The extension part ETP of the first upper support USP1 may penetrate the first inner surface 110a of the housing 110. The extension part ETP of the third upper support USP3 may penetrate the second inner surface 110b of the housing 110. The extension parts ETP' of the second and fourth upper supports USP2' and USP4' may penetrate the third inner surface 110c of the housing 110. Rotational operations of the first, second, third, and fourth upper supports USP1, USP2', USP3, and USP4' may be controlled by using the portions ETPa and ETPa' of the extension parts ETP and ETP', which portions ETPa and ETPa' extend outwardly from the housing 110.

The first, second, third, and fourth upper supports USP1, USP2', USP3, and USP4' may have their rotation parts RTP and RTP'. The rotation parts RTP and RTP' may be correspondingly adjacent to distal ends of the first, second, third, and fourth upper supports USP1, USP2', USP3, and USP4'. The rotation parts RTP and RTP' may correspondingly protrude from the first, second, third, and fourth upper supports USP1, USP2', USP3, and USP4'. The rotation parts RTP and RTP' may have their protruding directions correspondingly orthogonal to extending directions of the first, second, third, and fourth upper supports USP1, USP2', USP3, and USP4'. The rotation parts RTP and RTP' may protrude from the first, second, third, and fourth upper supports USP1, USP2', USP3, and USP4' in directions away from the first hold members LOM1 of the first, second, third, and fourth lower supports LSP1, LSP2, LSP3, and LSP4.

As indicated by arrows shown in FIG. 8, the first, second, third, and fourth upper supports USP1, USP2', USP3, and USP4' may rotate by manipulating the portions ETPa and ETPa' of the extension parts ETP and ETP', which portions ETPa and ETPa' extend outwardly from the housing 110. The rotation of the first, second, third, and fourth upper supports USP1, USP2', USP3, and USP4' may drive the rotation parts RTP and RTP' to move to positions on the first, second, third, and fourth lower supports LSP1, LSP2, LSP3, and LSP4. For example, the rotation parts RTP of the first and third upper supporters USP1 and USP3 may move away from the opening OP, the rotation part RTP' of the second upper support USP2' may move away from the first inner surface 110a, and the rotation part RTP' of the fourth upper support USP4' may move away from the second inner surface 110b. Therefore, when viewed in a plan view, the rotation parts RTP and RTP' of the first, second, third, and fourth upper supports USP1, USP2', USP3, and USP4' may be positioned on the first, second, third, and fourth lower supports LSP1, LSP2, LSP3, and LSP4.

The rotation parts RTP and RTP' of the first, second, third, and fourth upper supports USP1, USP2', USP3, and USP4' may move onto the first, second, third, and fourth lower supports LSP1, LSP2, LSP3, and LSP4, and thus the second hold members LOM2 of the rotation parts RTP and RTP' may be correspondingly positioned on the first hold members LOM1. As magnetism of the first hold members LOM1 is different from that of the second hold members LOM2, the first, second, third, and fourth lower supports LSP1, LSP2, LSP3, and LSP4 may attract the rotation parts RTP and RTP' of the first, second, third, and fourth upper supports USP1, USP2', USP3, and USP4'. For example, the substrate SUB may be fixed between the first to fourth lower supports LSP1, LSP2, LSP3, and LSP4 and the rotation parts RTP and RTP' of the first to fourth upper supports USP1, USP2', USP3, and USP4'.

Figure 9:
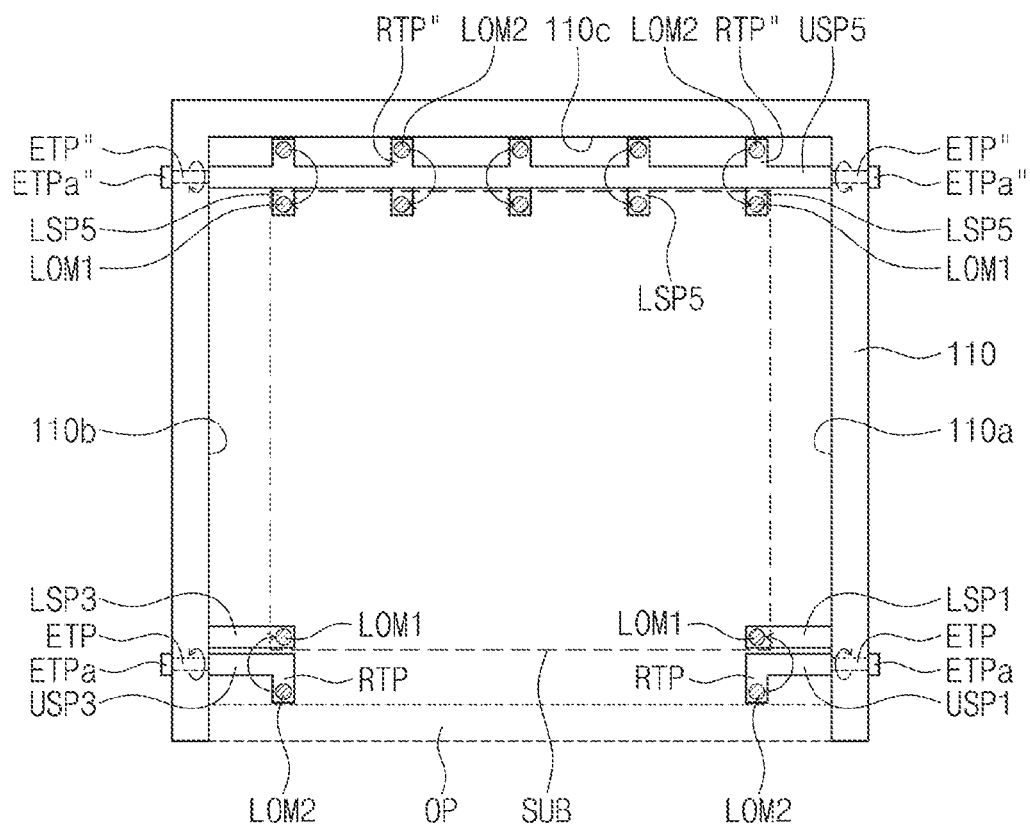

FIG. 9 illustrates a plan view showing a substrate transfer device according to some exemplary embodiments of the present inventive concepts. The substrate hold structure 120 may have first, third, and fifth lower supports LSP1, LSP3, and LSP5, and may also have first, third, and fifth upper supports USP1, USP3, and USP5 that correspond to the first, third, and fifth lower supports LSP1, LSP3, and LSP5.

The first lower support LSP1 may be provided on the first inner surface 110a of the housing 110. The first lower support LSP1 may be connected to and fixed to the first inner surface 110a. The third lower support LSP3 may be provided on the second inner surface 110b of the housing 110. The third lower support LSP3 may be connected and fixed to the second inner surface 110b. A plurality of fifth lower supports LSP5 may be provided on the third inner surface 110c of the housing 110. The fifth lower supports LSP5 may be connected to and fixed to the third inner surface 110c. The first and third lower supports LSP1 and LSP3 may be disposed adjacent to the opening OP. On the third inner surface 110c of the housing 110, the fifth lower supports LSP5 may be arranged along a direction from the first inner surface 110a toward the second inner surface 110b.

Each of the first, third, and fifth lower supports LSP1, LSP3, and LSP5 may have a first hold member LOM1. The first hold members LOM1 may be correspondingly provided at distal ends of the first, third, and fifth lower supports LSP1, LSP3, and LSP5. For example, the first lower support LSP1 may have a first hold member LOM1 at its distal end far from the first inner surface 110a of the housing 110. For example, the third lower support LSP3 may have a first hold member LOM1 at its distal end far from the second inner surface 110b of the housing 110. For example, the fifth lower supports LSP5 may have their first hold members LOM1 at their distal ends far from the third inner surface 110c of the housing 110.

The substrate SUB loaded into the housing 110 may be supported by the first, third, and fifth lower supports LSP1, LSP3, and LSP5. For example, the substrate SUB may be positioned on the first hold members LOM1 of the first, third, and fifth lower supports LSP1, LSP3, and LSP5.

The first upper support USP1 may be provided on the first inner surface 110a of the housing 110. The first upper support USP1 may be connected to the first inner surface 110a. For example, the first upper support USP1 may have a shape that protrudes from the first inner surface 110a toward the second inner surface 110b. The third upper support USP3 may be provided on the second inner surface 110b of the housing 110. The third upper support USP3 may be connected to the second inner surface 110b. For example, the third upper support USP3 may have a shape that protrudes from the second inner surface 110b toward the first inner surface 110a. The fifth upper support USP5 may connect the first inner surface 110a to the second inner surface 110b of the housing 110. The first and third upper supports USP1 and USP3 may be disposed adjacent to the opening OP, and the fifth upper support USP5 may be disposed adjacent to the third inner surface 110c of the housing 110. When viewed in a plan view, the first and third upper supports USP1 and USP3 may be disposed closer to the opening OP than the first and third lower supports LSP1 and LSP3. In addition, when viewed in a plan view, the fifth upper support USP5 may be disposed closer to the third inner surface 110c than the first hold members LOM1 of the fifth lower supports LSP5. For example, the first hold members LOM1 of the first, third, and fifth lower supports LSP1, LSP3, and LSP5 may be positioned inside the first, third, and fifth upper supports USP1, USP3, and USP5. The substrate SUB may be placed on the first hold members LOM1, and thus the first and third upper supports USP1 and USP3 may extend to run across between the substrate SUB and the opening OP, and the fifth upper support USP5 may extend to run across between the substrate SUB and the third inner surface 110c.

Each of the first, third, and fifth upper supports USP1, USP3, and USP5 may be rotatably connected to the housing 110. For example, the first, third, and fifth upper supports USP1, USP3, and USP5 may have their extension parts ETP and ETP". The extension parts ETP and ETP' may extend from distal ends of the first, third, and fifth upper supports USP1, USP3, and USP5. The extension part ETP of the first upper support USP1 may penetrate the first inner surface 110a of the housing 110. The extension part ETP of the third upper support USP3 may penetrate the second inner surface 110b of the housing 110. The fifth upper support USP5 may have a plurality of extension parts ETP", and the extension parts ETP" of the fifth upper support USP5 may penetrate the first inner surface 110a and the second inner surface 110b of the housing 110. Rotational operations of the first, third, and fifth upper supports USP1, USP3, and USP5 may be controlled by using portions ETPa and ETPa" of the extension parts ETP and ETP", which portions ETPa and ETPa" extend outwardly from the housing 110.

The first, third, and fifth upper supports USP1, USP3, and USP5 may have their rotation parts RTP and RTP". The rotation parts RTP of the first and third upper supports USP1 and USP3 may correspondingly protrude from distal ends of the first and third upper supports USP1 and USP3. The fifth upper support USP5 may have a plurality of rotation parts RTP", and the rotation parts RTP" of the fifth upper support USP5 may protrude from intermediate portions of the fifth upper support USP5. The rotation parts RTP" of the fifth upper support USP5 may be spaced apart from each other at regular intervals along an extending direction of the fifth upper support USP5. The rotation parts RTP and RTP" may have their protruding directions that are correspondingly orthogonal to extending directions of the first, third, and fifth upper supports USP1, USP3, and USP5. For example, the rotation parts RTP of the first and third upper supports USP1 and USP3 may protrude toward the opening OP from the first and third upper supports USP1 and USP3. The rotation parts RTP" of the fifth upper support USP5 may protrude from the fifth upper support USP5 toward the third inner surface 110c. For example, the rotation parts RTP and RTP" may protrude from the first, third, and fifth upper supports USP1, USP3, and USP5 in directions away from the first hold members LOM1 of the first, third, and fifth lower supports LSP1, LSP3, and LSP5.

As indicated by arrows shown in FIG. 9, the first, third, and fifth upper supports USP1, USP3, and USP5 may rotate by manipulating the portions ETPa and ETPa" of the extension parts ETP and ETP", which portions ETPa and ETPa" extend outwardly from the housing 110. The rotation of the first, third, and fifth upper supports USP1, USP3, and USP5 may drive the rotation parts RTP and RTP" to move to positions on the first, third, and fifth lower supports LSP1, LSP3, and LSP5. For example, the rotation parts RTP of the first and third upper supports USP1 and USP3 may move away from the opening OP, and the rotation parts RTP" of the fifth upper support USP5 may move away from the third inner surface 110c. Therefore, when viewed in a plan view, the rotation parts RTP and RTP" of the first, third, and fifth upper supports USP1, USP3, and USP5 may be positioned on the first, third, and fifth lower supports LSP1, LSP3, and LSP5.

The rotation parts RTP and RTP" of the first, third, and fifth upper supports USP1, USP3, and USP5 may move onto the first, third, and fifth lower supports LSP1, LSP3, and LSP5, and thus the second hold members LOM2 of the rotation parts RTP and RTP" may be correspondingly positioned on the first hold members LOM1. As magnetism of the first hold members LOM1 is different from that of the second hold members LOM2, the first, third, and fifth lower supports LSP1, LSP3, and LSP5 may attract the rotation parts RTP and RTP" of the first, third, and fifth upper supports USP1, USP3, and USP5. For example, the substrate SUB may be fixed between the first, third, and fifth lower supports LSP1, LSP3, and LSP5 and the rotation parts RTP and RTP" of the first, third, and fifth upper supports USP1, USP3, and USP5.

A substrate transfer device according to some exemplary embodiments of the present inventive concepts may be configured such that a substrate is rigidly fixed and prevented from detachment during substrate transfer or storage. In addition, as the substrate is pushed and fixed in up-and-down directions, the substrate may be prevented from deformation such as warpage. Accordingly, the substrate transfer device may have improved storage stability.

Moreover, because only a bottom surface of the substrate is not supported, and because supports are provided only on corners of the substrate, a substrate hold structure may have a simplified structure and a smaller size. Furthermore, because the substrate is prevented from warpage, there may be no requirement for superfluous space in consideration of warpage of the substrate, and the substrate hold structures may be placed spaced apart from each other to reduce vertical intervals between the substrates. Therefore, there may be an increase in storage amount of the substrates in the substrate transfer device.

Although the present inventive concepts have been described in connection with some exemplary embodiments of the present inventive concepts illustrated in the accompanying drawings, it will be understood by one of skill in the art that variations in form and details may be made therein without departing from the spirit and essential features of the present inventive concepts. The above disclosed exemplary embodiments should thus be considered only illustrative and not restrictive.

What is claimed is:

1. A substrate transfer device, comprising:
a housing having a surface that has an opening through which a substrate is introduced; and
a substrate hold structure that fixes the substrate in the housing,
wherein the substrate hold structure includes:
a lower support that extends onto a bottom surface of the substrate from one of inner surfaces of the housing, the lower support including a first hold member beneath the substrate; and
an upper support that extends toward a side of the substrate from one of the inner surfaces of the housing, the upper support including a second hold member,
wherein an operation of the upper support causes the second hold member to move onto the substrate such that the second hold member contacts a top surface of the substrate and overlaps the first hold member with the substrate between the second hold member and the first hold member, and wherein an extension part of the upper support penetrates the housing and protrudes onto an outer surface of the housing.

2. The substrate transfer device of claim 1, wherein the operation of the upper support includes allowing the upper support to rotate about the extension part of the upper support, the extension part protruding onto the outer surface of the housing, and the extension part serving as an axis of rotation.

3. The substrate transfer device of claim 1, wherein
the lower support is fixed to a first inner surface of the inner surfaces of the housing,
the extension part of the upper support penetrates the first inner surface,
the upper support extends between the substrate and a second inner surface of the inner surfaces of the housing, the second inner surface being adjacent to the first inner surface, and
the second hold member of the upper support is at a rotation part that protrudes from the upper support in a vertical direction between the second inner surface and the substrate.

4. The substrate transfer device of claim 1, wherein
the lower support is fixed to a first inner surface of the inner surfaces of the housing,
the extension part of the upper support penetrates a second inner surface of the inner surfaces of the housing, the second inner surface being adjacent to the first inner surface,
the upper support extends between the substrate and the first inner surface of the housing, and
the second hold member of the upper support is at a rotation part that protrudes from the upper support in a vertical direction between the first inner surface and the substrate.

5. The substrate transfer device of claim 1, wherein
each of the lower support and the upper support are provided in plural,
each of the plurality of lower supports is adjacent to one of corners of the substrate, and
each of the plurality of upper supports is adjacent to one of the corners of the substrate to allow the plurality of upper supports to correspond to the plurality of lower supports.

6. The substrate transfer device of claim 1, wherein
the upper support runs across between the substrate and a third inner surface of the inner surfaces of the housing,
the extension part of the upper support is provided in plural, and the plurality of extension parts penetrate fourth and fifth inner surfaces of the inner surfaces of the housing, the fourth and fifth inner surfaces being adjacent to the third inner surface and opposite to each other,
the lower support is provided in plural, and the plurality of lower supports are fixed to the third inner surface of the housing, and
the second hold member of the upper support is provided in plural, and each of the plurality of second hold members is at one of rotation parts that protrude from the upper support in a vertical direction between the third inner surface of the substrate.

7. The substrate transfer device of claim 6, wherein
the upper support operates to rotate about the extension parts of the upper support, the extension parts serving as an axis of rotation, and
each of the second hold members of the upper support moves onto the substrate to overlap one of the first hold members with the substrate between the second hold member and the first hold member.

8. The substrate transfer device of claim 1, wherein the first hold member and the second hold member include a magnet, magnetism of the magnet of the first hold member being different from magnetism of the magnet of the second hold member.

9. The substrate transfer device of claim 1, wherein
the upper support has an L shape,
the upper support includes:
the extension part that extends to penetrate the housing; and
a rotation part that protrudes onto the top surface of the substrate from an end of the upper support, the end of the upper support being between the substrate and the housing, and
the second hold member is at the rotation part.

10. The substrate transfer device of claim 1, wherein
the substrate hold structure are provided in plural, and
the plurality of substrate hold structures are vertically arranged in the housing.

11. A substrate transfer device, comprising:
a housing having a surface that has an opening through which a substrate is introduced;
a lower support fixed to a first inner surface of the housing, the lower support supporting the substrate from beneath the substrate; and
an upper support connected to the first inner surface and being capable of rotational operation in a direction perpendicular to the first inner surface of the housing, the upper support extending onto the substrate,
wherein the lower support includes a first hold member beneath the substrate,
wherein the upper support includes a second hold member above the substrate, and
wherein the rotational operation of the upper support causes:
a first operation in which the upper supporter does not overlap the substrate when viewed in a plan view; and
a second operation in which the second hold member moves onto the substrate to push the substrate to the lower support.

12. The substrate transfer device of claim 11, wherein the upper support further includes an extension part that penetrates the housing and protrudes onto an outer surface of the housing,
wherein the rotational operation of the upper support is performed by rotating an extension part that protrudes onto the outer surface of the housing.

13. The substrate transfer device of claim 11, wherein the first hold member and the second hold member include a magnet, magnetism of the magnet of the first hold member being different from magnetism of the magnet of the second hold member.

14. The substrate transfer device of claim 11, wherein
the lower support extends from the first inner surface of the housing onto a bottom surface of the substrate,
the upper support extends from the first inner surface of the housing toward a space between the substrate and a second inner surface of the housing, the second inner surface being adjacent to the first inner surface, the upper supports further includes a rotation part that protrudes from an end of the upper support onto a top surface of the substrate, the end of the upper support being between the substrate and the second inner surface of the housing, and the second hold member is at the rotation part.

15. The substrate transfer device of claim 11, wherein the substrate has a tetragonal shape when viewed in a plan view, each of the lower support and the upper supports are provided in plural, each of the plurality of lower supports is adjacent to one of corners of the substrate, and each of the plurality of upper supports is adjacent to one of the corners of the substrate to allow the plurality of upper supports to correspond to the plurality of lower supports.

16. The substrate transfer device of claim 11, wherein in the second operation of the upper support, the first hold member and the second hold member vertically overlap each other, the first hold member is in contact with a bottom surface of the substrate, and the second hold member is in contact with a top surface of the substrate.

17. A substrate transfer device, comprising:

a housing having a surface that has an opening through which a substrate is introduced, the housing having a first inner surface and a second inner surface that are adjacent to each other;

a lower support that extends from the first inner surface of the housing onto a bottom surface of the substrate; and an upper support that extends from the second inner surface of the housing onto a top surface of the substrate and is connected to the second inner surface and being capable of rotational operation in a direction perpendicular to the second inner surface of the housing, wherein the lower supporter includes a first hold member beneath the substrate, wherein the upper supporter includes a second hold member above the substrate, and wherein the rotational operation of the upper supporter causes:

a first operation in which the upper supporter moves toward a side of the substrate; and a second operation in which the upper supporter moves onto and contacts the top surface of the substrate.

18. The substrate transfer device of claim 17, wherein in the second operation of the upper support, the first hold member and the second hold member vertically overlap each other, and the second hold member moves onto the substrate to push the substrate to the lower supporter.

19. The substrate transfer device of claim 17, wherein the upper support extends from the second inner surface of the housing toward a space between the substrate and the first inner surface of the housing, the upper support further includes a rotation part that extends from an end of the upper support onto the top surface of the substrate, the end of the upper support being between the substrate and the first inner surface of the housing, and the second hold member is at the rotation part.

20. The substrate transfer device of claim 17, wherein the first hold member and the second hold member include a magnet, magnetism of the magnet of the first hold member being different from magnetism of the magnet of the second hold member.

* * * * *